(12) United States Patent
Oh

(10) Patent No.: US 9,136,272 B2
(45) Date of Patent: Sep. 15, 2015

(54) SEMICONDUCTOR DEVICE

(71) Applicant: SK hynix Inc., Gyeonggi-do (KR)

(72) Inventor: Sung Lae Oh, Chungcheongbuk-do (KR)

(73) Assignee: SK Hynix Inc., Gyeonggi-do (KR)

( * ) Notice: Subject to any disclaimer, the term of this patent is extended or adjusted under 35 U.S.C. 154(b) by 22 days.

(21) Appl. No.: 14/062,497

(22) Filed: Oct. 24, 2013

(65) Prior Publication Data

US 2014/0346611 A1 Nov. 27, 2014

(30) Foreign Application Priority Data

May 27, 2013 (KR) ........................ 10-2013-0059713

(51) Int. Cl.
*H01L 27/00* (2006.01)
*H01L 27/112* (2006.01)
*H01L 27/115* (2006.01)
*G11C 16/10* (2006.01)

(52) U.S. Cl.
CPC .......... *H01L 27/11286* (2013.01); *G11C 16/10* (2013.01); *H01L 27/11526* (2013.01); *H01L 27/11573* (2013.01); *H01L 27/11548* (2013.01); *H01L 27/11556* (2013.01); *H01L 27/11575* (2013.01); *H01L 27/11582* (2013.01)

(58) Field of Classification Search
CPC ................... H01L 27/11286; H01L 27/11526; H01L 27/11573; H01L 27/11556; H01L 27/11575; H01L 27/11548
See application file for complete search history.

(56) References Cited

U.S. PATENT DOCUMENTS

2005/0146961 A1 7/2005 Osada et al.
2007/0297232 A1* 12/2007 Iwata ........................ 365/185.17
2008/0029805 A1* 2/2008 Shimamoto et al. .......... 257/315

FOREIGN PATENT DOCUMENTS

KR 1020090046643 5/2009
KR 1020120043913 5/2012

* cited by examiner

*Primary Examiner* — Victor A Mandala
*Assistant Examiner* — Quovaunda V Jefferson
(74) *Attorney, Agent, or Firm* — IP & T Group LLP

(57) ABSTRACT

A semiconductor device may include a voltage supply unit suitable for supplying a voltage, a first conductive line coupled to the voltage supply unit, a second conductive line formed over the first conductive line, a voltage contact plug formed over the second conductive line, a voltage transmission line formed over the voltage contact plug, and a switching element suitable for switching the voltage transferred from the voltage transmission line.

19 Claims, 5 Drawing Sheets

SEMICONDUCTOR DEVICE

CROSS-REFERENCE TO RELATED APPLICATION

The present application claims priority to Korean patent application number 10-201-0059713 filed on May 27, 2013, in the Korean Intellectual Property Office, the entire disclosure of which is incorporated by reference herein.

BACKGROUND

1. Technical Field

Various embodiments relate generally to an electronic device.

2. Related Art

As integration of a semiconductor device increased, the size of a memory cell decreased, and as a result, the level of difficulty with a manufacturing process increased. Recently, due to the limit in increase in integration of a 2-dimensional (2D) semiconductor device having a channel arranged horizontal to a semiconductor substrate, a 3-dimensional (3D) semiconductor device having a vertical channel is proposed.

A memory cell array of the 3D semiconductor device includes a plurality of memory blocks. Each of the memory blocks includes a plurality of cell strings disposed vertically relative to a surface of a semiconductor substrate. More specifically, the cell strings include a vertical channel formed in a vertical direction to the surface of the semiconductor substrate, a drain selection transistor, memory cells, and a source selection transistor. The drain selection transistor, the memory cells, and the source selection transistor are formed along the vertical channel.

Since the cell strings of the 3D semiconductor device having the vertical channel have heights greater than those of the cell strings of the 2D semiconductor device, a structure of peripheral circuits configured to program read and erase the memory cells may be modified according to the structure change of the cell strings from 2D to 3D.

The peripheral circuits receive a power voltage, a ground voltage or other various voltage levels through a voltage line or a ground line, and operate based on various control signals output from a control circuit. In particular, among the peripheral circuits, page buffers coupled to the cell strings through bit lines include a plurality of elements such as a latch, a precharge switch and a discharge switch. Among the elements, switching elements configured to transmit the power voltage, the ground voltage or the voltages of various levels may malfunction when the voltage is supplied properly, thereby deteriorating reliability of the semiconductor device.

BRIEF SUMMARY

Various embodiments relate to a semiconductor device.

In an exemplary embodiment of the present invention, a semiconductor device may include a voltage supply unit suitable for supplying a voltage, a first conductive line coupled to the voltage supply unit, a second conductive line formed over the first conductive line, a voltage contact plug formed over the second conductive line, a voltage transmission line formed over the voltage contact plug, and a switching element suitable for switching the voltage transferred from the voltage transmission line.

In another exemplary embodiment of the present invention, a semiconductor device may include a gate line formed at a first region of a substrate, a junction region formed in contact with the gate line, a first gate contact plug formed over the junction region, a second gate contact plug formed over the first gate contact plug, a first conductive line formed at a second region of the substrate, a second conductive line formed over the first conductive line, a voltage contact plug formed over the second conductive line, and a voltage transmission line suitable for coupling the second gate contact plug to the voltage contact plug.

In still another exemplary embodiment of the present invention, a semiconductor device may include a memory cell array including vertical strings, a plurality of lines coupled over the vertical strings, a switching element including a junction region and a gate line, a gate contact plug coupled to the junction region, a first conductive line, a second conductive line formed over the first conductive line, a voltage contact plug formed over the second conductive line, and a voltage transmission line suitable for coupling the gate contact plug to the voltage contact plug, wherein the voltage transmission line formed on a same plane as the plurality of lines.

DETAILED DESCRIPTION

Figure 1:
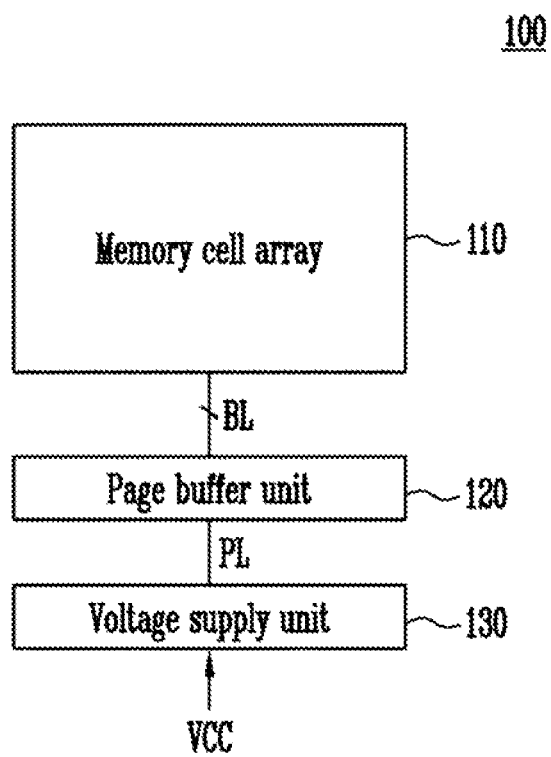
FIG. 1 is a block diagram illustrating a part of a semiconductor device according to an embodiment of the present invention.

Hereinafter, various embodiments will be described in detail with reference to the accompanying drawings. The drawings are provided to allow those having ordinary skill in the art to understand the scope of the embodiments of the disclosure. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like numbered parts in the various figures and embodiments of the present invention.

The drawings are not necessarily to scale and in some instances, proportions may have been exaggerated in order to clearly illustrate features of the embodiments. It should be readily understood that the meaning of "on" and "over" in the present disclosure should be interpreted in the broadest manner such that "on" means not only "directly on" but also something with an intermediate feature(s) or a layer(s) therebetween, and that "over" means not only directly on top but also on top of something with an intermediate feature(s) or a layer(s) therebetween. It is also noted that in this specification, "connected/coupled" refers to one component not only directly coupling another component but also indirectly coupling another component through an intermediate component. In addition, a singular form may include a plural form as long as it is not specifically mentioned in a sentence.

FIG. 1 is a block diagram illustrating a part of a semiconductor device according to an embodiment of the present invention.

Referring to FIG. 1, the semiconductor device 100 may include a memory cell array 110 suitable for storing data, a page buffer unit 120 coupled to the memory cell array 110 through bit lines BL suitable for sending/receiving data, and a voltage supply unit 130 suitable for supplying a power voltage VCC, a ground voltage VSS or voltages of various levels. The semiconductor device may further include various peripheral circuits and control circuits, which will not be described herein.

Figure 2:
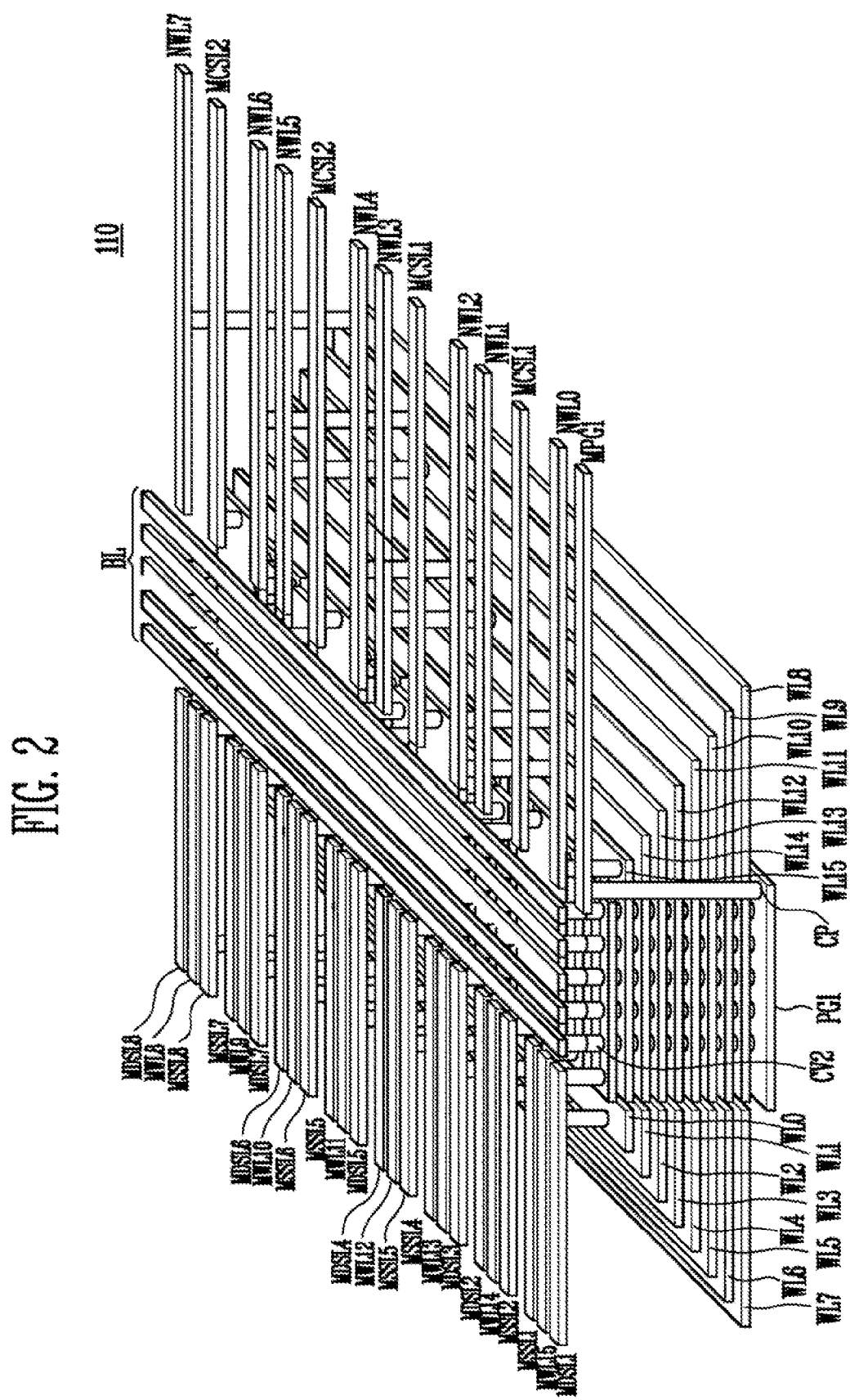
FIG. 2 is a 3-dimensional view illustrating in detail the memory cell array shown in FIG. 1.

FIG. 2 is a 3-dimensional view illustrating in detail a memory cell array shown in FIG. 1.

Since FIG. 2 is a 3-dimensional view illustrating the 3-dimensional memory cell array 110 to help one's understanding, the configuration may vary depending on the semiconductor device.

Referring to FIG. 2, the memory cell array 110 of the 3-dimensional semiconductor device may include a plurality of memory blocks. The memory blocks may include a plurality of vertical strings formed in a vertical direction to a surface of a semiconductor substrate. The vertical strings may include a vertical channel layer CV2 and a plurality of memory cells that are stacked while separated apart along the vertical channel layer CV2. The memory cells may be coupled to word lines WL0 to WL15. A pipe gate PG1 may be formed on a lowermost part of the vertical channel layer CV2 of the vertical strings. The bit lines BL or source lines (not shown) may be coupled on an uppermost part of the vertical channel layer CV2 of the vertical strings.

Lines MWL0 to MWL15, MDSL1 to MDSL8, MCSL1 to MCSL4 and MPG1 may be coupled to contact plugs CP that pass through in the vertical direction of the word lines WL0 to WL15, drain selection lines (not shown), common source lines (not shown) and the pipe gate PG1, respectively. The contact plugs CP over the vertical channel layers CV2 that pass through the same drain selection line in the vertical direction may be coupled to different bit lines BL. An insulating layer (not shown) may be formed between each of the lines in order to electrically insulate the lines.

Figure 3:
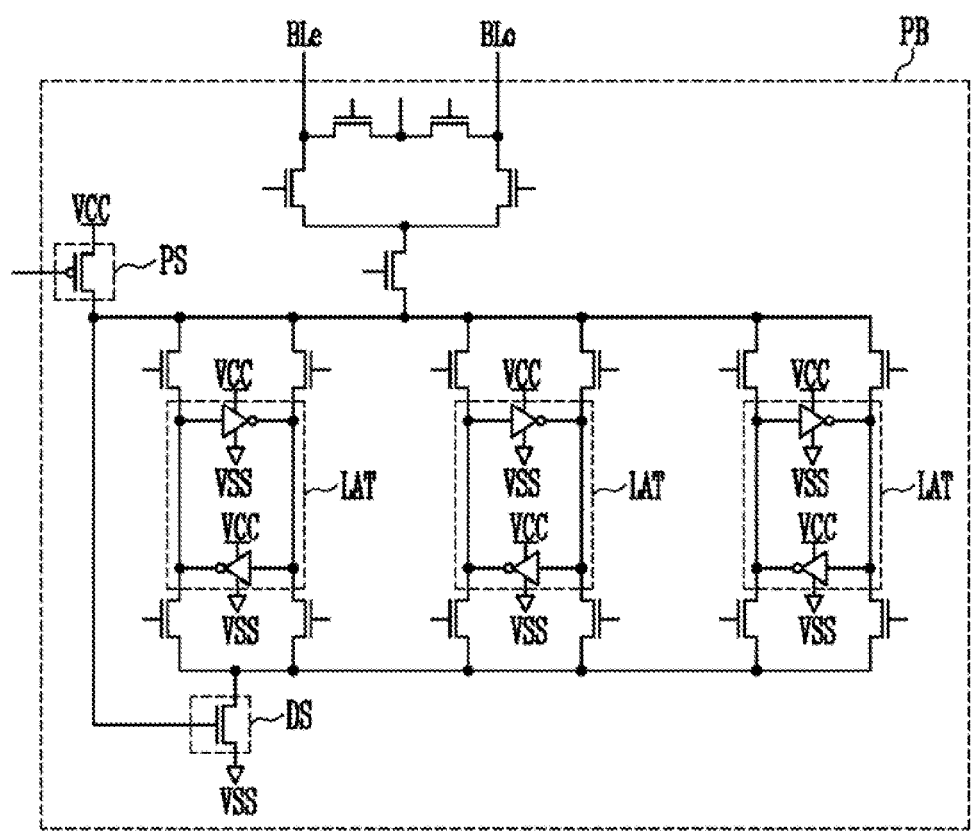
FIG. 3 is a schematic circuit diagram illustrating the page buffer unit shown in FIG. 1.

FIG. 3 is a schematic circuit diagram illustrating the page buffer unit shown in FIG. 1.

FIG. 3 is a diagram illustrating the page buffer unit in order to describe switching elements that transmit a voltage supplied from a voltage supply unit 130. The page buffer unit may vary depending on the semiconductor device.

Referring to FIG. 3, the page buffer unit 120 coupled to the memory cell array 110 through the bit lines BLe to BLo may include a plurality of page buffers PB. Since the page buffers PB may be formed to be substantially the same as each other, only one of the page buffers PB will be described in FIG. 3 for convenience. Each of the page buffers PB may include a plurality of latches LAT suitable for storing data, a precharge circuit PS suitable for precharging a predetermined line or node or transmitting a power voltage VCC to the predetermined line or node, a discharge circuit DS suitable for discharging a predetermined line or node, and a plurality of switching elements suitable for transmitting data or signals. The latches LAT may be formed of a plurality of inverters, and the power voltage VCC and the ground voltage VSS may be supplied to each of the inverters. The precharge circuit PS may be formed of a PMOS transistor. The power voltage VCC may be supplied to a drain of the PMOS transistor, and a line to be precharged may be coupled to a source of the PMOS transistor. The discharge circuit DS may be formed of an NMOS transistor. A line to be discharged may be coupled to a drain of the NMOS transistor coupled to the ground voltage VSS. Here, coupling of a predetermined line or node to the ground voltage VSS means that the predetermined line or node is coupled to a ground terminal. The voltage supply unit 130 may supply the power voltage VCC, the ground voltage VSS or voltages of various levels to the latch LAT, the precharge circuit PS, and the discharge circuit DS.

Figure 4:
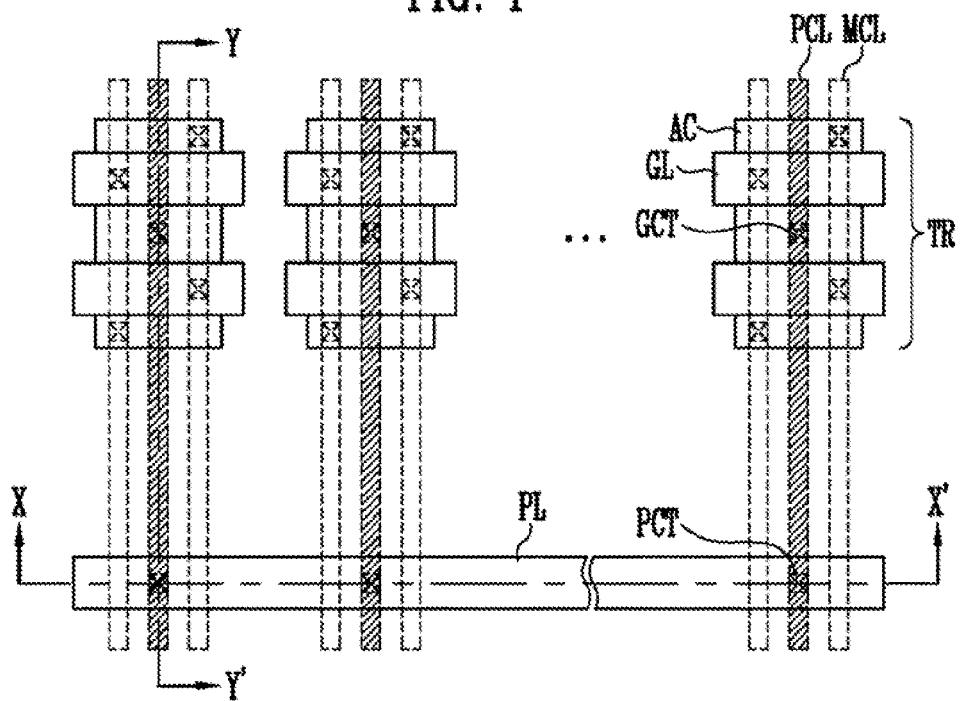
FIG. 4 is a layout view illustrating the arrangement between a voltage line and elements according to an embodiment of the present invention.

FIG. 4 is a layout view illustrating the arrangement between a voltage line and elements according to an embodiment of the present invention.

Referring to FIG. 4, switching elements TR that transmit the power voltage VCC, among the elements included in the page buffer PB, are shown. Each of the switching elements TR may include a gate line GL and junction regions AC contacting both ends of the gate line GL. A voltage line PL coupled to the power supply unit 130 and to which the power voltage VCC is supplied is arranged as separated from the switching elements TR. A plurality of lines PCL and MCL formed over the switching elements TR and the voltage line PL may be arranged to transmit the power voltage or operating signals. For example, the lines PCL and MCL may include a voltage transmission line PCL and a signal transmission line MCL. The voltage transmission line PCL may electrically connect the voltage line PL and the switching element TR together. The voltage transmission line PCL may be coupled to the junction region AC of the switching element TR through a gate contact plug GCT and may be coupled to the voltage line PL through a voltage contact plug PCT.

Figure 5:
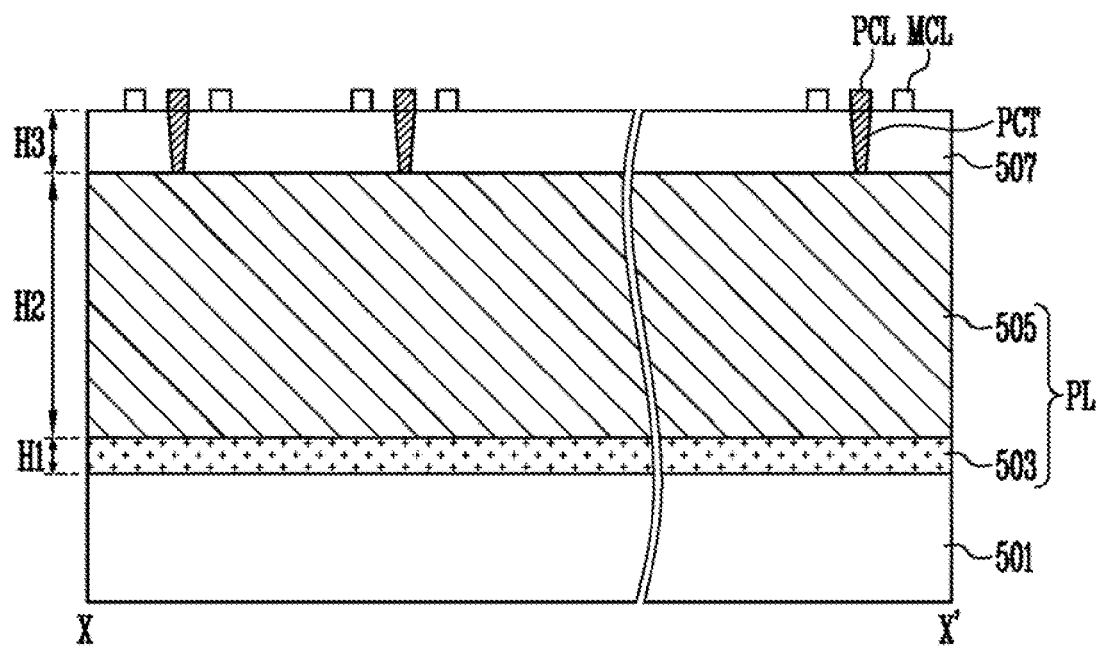
FIG. 5 is a cross-sectional view illustrating in detail a cross section taken along a X-X' direction shown in FIG. 4.

FIG. 5 is a cross-sectional view illustrating in detail a cross section taken along X-X' direction shown in FIG. 4.

Referring to FIG. 5, the voltage line PL may be formed over a semiconductor substrate 501, and an interlayer insulating layer 507 may be formed over the voltage line PL. A plurality of voltage contact plugs PCT may be formed to contact the voltage line PL passing through the interlayer insulating layer 507, and voltage transmission lines PCL may be formed over the voltage contact plugs PCT. A plurality of signal transmission lines MCL may be formed to be parallel to directions of voltage transmission lines PCL, over the interlayer insulating layer 507.

The voltage line PL may include a first conductive line 503 and a second conductive line 505, which are sequentially stacked over the semiconductor substrate 501. The first conductive line 503 may be a conductive layer formed at the same time as the gate line GL of the switching element TR is formed and may be formed of the same material as the gate line GL. For example, the first conductive line 503 may be formed of polysilicon. Since the first conductive line 503 of the voltage line PL may be formed at the same time as the gate line GL is formed, a height H1 of the first conductive line 503 may be the same as a height of the gate line GL. Here, the height H1 may be the same as the thickness of the first conductive line 503 or the gate line GL.

The second conductive line 505 may be a conductive layer to easily electrically connect the voltage transmission lines PCL and the first conductive line 503 and to easily form the voltage contact plug PCT. Since the memory cells are stacked in the vertical direction to the surface of the semiconductor substrate, in the 3D device, the lines MWL0 to MWL15, MDSL1 to MDSL8, MCSL1 to MCSL4, MPG1 and BL for transmitting various voltages may vary in height. Consequently, the second conductive line 505 may be formed in order to easily make electrical connection between the first conductive line 503 and the voltage transmission line PCL.

A height H2 of the second conductive line 505 may be greater than the height H1 of the first conductive line 503. The height H2 may be set in consideration of a width and a height of the voltage contact plug PCT. In order to form the voltage contact plug PCT, a contact hole may need to be formed. Due to characteristics of an etching process, a width of an upper part of the contact hole may be formed narrower than a width of a lower part of the contact hole. In order to increase the height of the contact hole, the width of the contact hole may be increased, which may lead to the increase of the semiconductor device in size. As the second conductive line 505 is formed with a sufficient height as high as the set height H2, a height H3 of the contact hole to form the voltage contact plug PCT may be lowered, and the width of the contact hole may be narrowed as a result.

The height H2 of the second conductive line 505 may be greater than the height H3 of the voltage contact plug PCT. In addition, narrowing the width of the contact hole decreases a width of the upper part of the voltage contact plug PCT that is formed by filling an inside of the contact hole with a conductive material and therefore the size of the semiconductor device may also decrease. For example, the height H2 of the second conductive line 505 may be formed to be 2 μm, which may vary according to a device design.

The overall size of the semiconductor device may be decreased since the width of the voltage line PL that is formed under the voltage contact plug PCT may be formed narrow. The height H2 may be the same as the thickness of the second conductive line 505.

The second conductive line 505 may be formed as a line over the first conductive line 503. In order to reduce the resistance of the voltage line PL, the second conductive line 505 may be formed of a material having a lower resistance than that of polysilicon. For example, the second conductive line 505 may be formed of tungsten.

After the interlayer insulating layer 507 is formed over the second conductive line 505, the voltage contact plug PCT may be formed by partially etching the interlayer insulating layer 507, forming the contact holes that partially expose the second conductive line 505, and filling the inside of the contact holes with a conductive material. The voltage contact plug PCT may be formed of the same material as that of the second conductive line 505. For example, the voltage contact plug PCT may be formed of tungsten.

Figure 6:
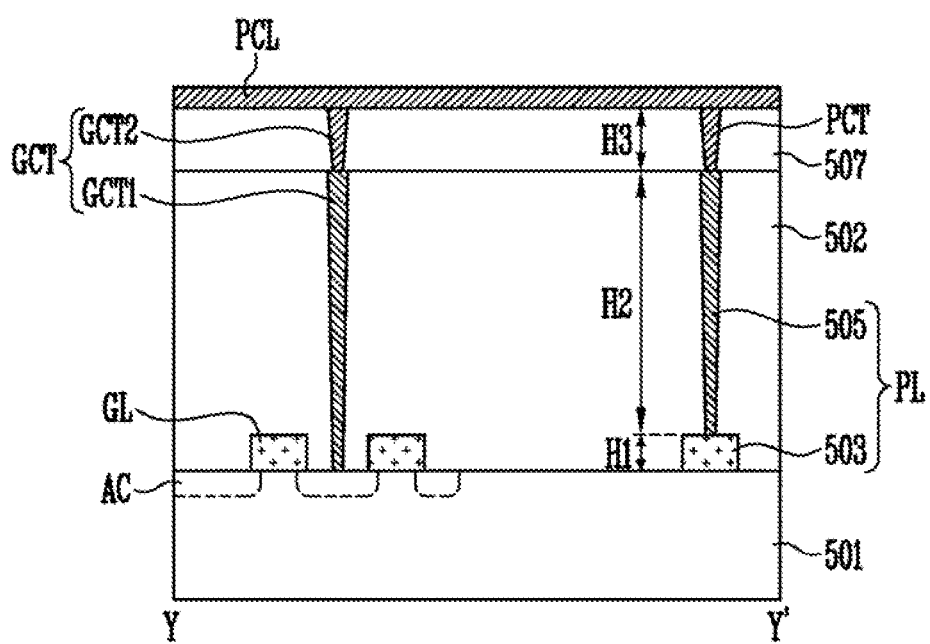
FIG. 6 is a cross-sectional view illustrating in detail a cross section taken along a Y-Y' direction shown in FIG. 4.

FIG. 6 is a cross-sectional view illustrating in detail a cross section taken along a Y-Y' direction shown in FIG. 4.

Referring to FIG. 6, gate lines GL and the voltage line PL may be formed over the semiconductor substrate 501. For example, the gate lines GL may be formed over a portion of the semiconductor substrate 501, in which the junction region AC is formed. The junction region AC may contact both ends of the gate line GL, and the first conductive line 503 and the second conductive line 505 of the voltage line PL sequentially stacked over the semiconductor substrate 501. The interlayer insulating layer 502 may be formed over the semiconductor substrate 501 where the gate lines GL and the first conductive line 503 are formed.

The gate contact plug GCT may include a first gate contact plug GCT1 and a second conductive line 505 simultaneously formed with the same material. For example, the first gate contact plug GCT1 and the second conductive line 505 may be formed of tungsten.

Hereinafter, a method of forming the first gate contact plug GCT1 and the second conductive line 505 will be described in detail.

The contact hole partially exposing the junction region AC between the gate lines GL and a trench partially exposing the first conductive line 503 may be formed by partially exposing the interlayer insulating layer 502. The first gate contact plug GCT1 and the second conductive line 505 may be formed by filling the contact hole and the trench with the conductive material. The first gate contact plug GCT1 and the second conductive line 505 may be formed to have the same widths. For example, the widths of the first gate contact plug GCT1 and the second conductive line 505 may be formed to be 110 nm wide each, which may vary according to a device design. The second conductive line 505 may be stacked over the first conductive line 503, thereby forming the voltage line PL including the first and second conductive lines 503 and 505.

The gate contact plug GCT may include the first and second gate contact plugs GCT1 and GCT2. The second gate contact plug GCT2 may be formed over the first gate contact plug GCT1. The voltage contact plug PCT may be formed over the second conductive line 505. The second gate contact plug GCT2 and the voltage contact plug PCT may have substantially the same widths. The second gate contact plug GCT2 and the voltage contact plug PCT may have a height H3 that is lower than the height H2 of the first gate contact plug GCT1 and the second conductive line 505. Therefore, the second gate contact plug GCT2 and the voltage contact plug PCT may have narrower widths than those of the first gate contact plug GCT1 and the second conductive line 505. The height. H3 may be substantially the same as the thickness of the second gate contact plug GCT2 or the voltage contact plug PCT. The interlayer insulating layer 507 may be formed between the second gate contact plug GCT2 and the voltage contact plug PCT.

The voltage transmission line PCL may be formed over the second gate contact plug GCT2, the voltage contact plug PCT and the interlayer insulating layer 507. The voltage transmission line PCL may be coupled to the second gate contact plug GCT2 and the voltage contact plug PCT. Accordingly, a voltage is supplied to the junction region AC through the voltage line PL, the voltage contact plug PCT, the voltage transmission line PCL and the gate contact plug GCT.

Figure 7:
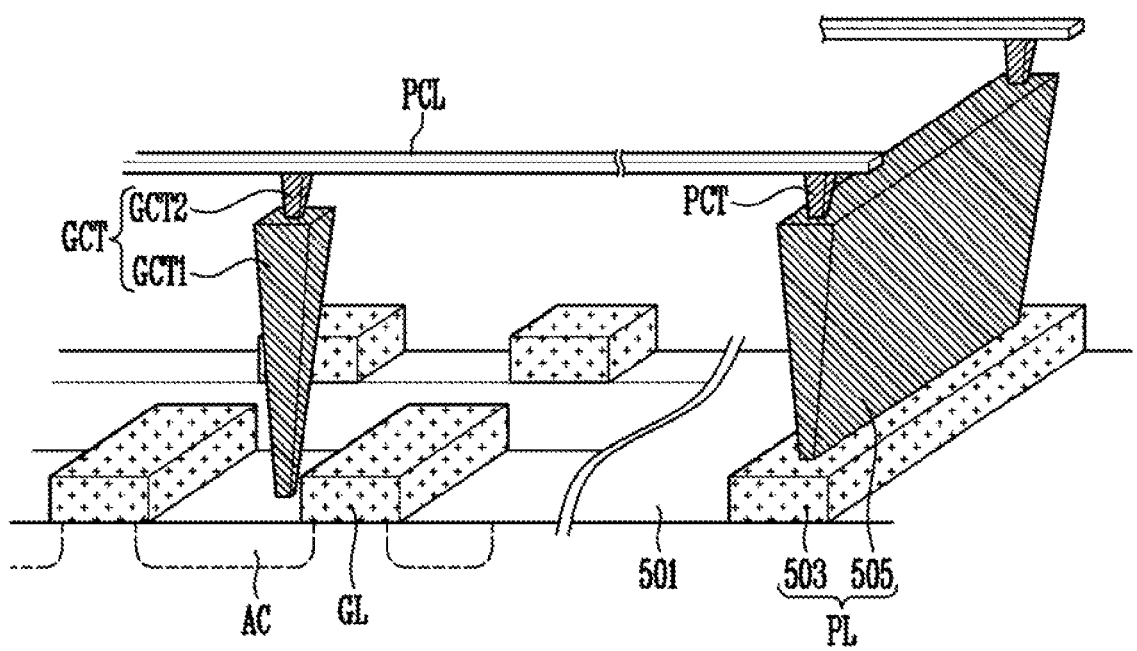
FIG. 7 is a 3-dimensional view illustrating in detail the coupling relationship of a voltage line according to an embodiment of the present invention.

FIG. 7 is a 3-dimensional view illustrating in detail the coupling relationship of a voltage line according to an embodiment of the present invention. It is a 3-dimensional view of FIGS. 4 to 6 combined.

Referring to FIG. 7, a first region is defined as a region where elements receive a voltage (for example, switching elements, nodes or lines), and a second region is defined as a region where the voltage line PL is formed. For example, the first region may be a region where the page buffer unit 120 is formed. Gate lines GL for switching elements may be provided in the first region. The junction region AC may be formed at the semiconductor substrate 501 between the gate liens GL.

The first gate contact plug GCT1 may be formed over the junction region AC, and the second gate contact plug GCT2 may be formed over the first gate contact plug GCT1. The first and second gate contact plugs GCT1 and GCT2 as stacked may be the gate contact plug GCT.

The voltage transmission line PCL may be formed over the second gate contact plug GCT2. The first conductive line 503 for the voltage line PL may be formed in the second region of the semiconductor substrate 501, and the second conductive line 505 for the voltage line PL may be formed over the first conductive line 503. The first and second conductive lines 503 and 505 as stacked may be the voltage line PL.

The height H1 plus the height H2, which indicate a height ranging from a bottom of the first conductive line 503 to a top of the second conductive line 505, may be the same as a height from a bottom of the first gate contact plug GCT1 to a top of the second gate contact plug GCT2. The voltage contact plug PCT may be formed over the second conductive line 505. The height H3 from a bottom of the voltage contact plug PCT to a top of the voltage contact plug PCT may be substantially the same as a height from a bottom of the second gate contact plug GCT2 to the top of the second gate contact plug GCT2.

The voltage transmission line PCL may be formed over the voltage contact plug PCT. A height from a top of the semiconductor substrate 501 to a bottom of the voltage transmission line PCL may be the same as a height from the top of the semiconductor substrate 501 to a bottom of each of the lines of the memory cell array, MWL0 to MWL15, MDSL1 to MDSL8, MCSL1 to MCSL4, MPG1 and BL illustrated in FIG. 2. A voltage may be transmitted to the junction region AC through the voltage line PL, the voltage contact plug PCT, the voltage transmission line PCL and the gate contact plug GCT.

When a turn-on voltage is supplied to the gate line GL, a channel may be formed at the bottom of the gate line GL at a portion of a semiconductor substrate 501, so a voltage may be transmitted to the junction region AC on the opposite side of the gate line GL.

As disclosed so far, the voltage line PL of the line shape with the sufficient height prevent electrical block-off between the voltage transmission line PCL and the voltage line PL. Further, since the voltage line PL with the sufficient height may narrow the width of the voltage contact plug PCT, the width of the voltage transmission lines PCL is decreased, and the size of the semiconductor device may be thus reduced.

The semiconductor device in various embodiments herein may facilitate the manufacturing process and may reduce the resistance of the voltage line.

The semiconductor according to an embodiment may be employed in both the 3-dimensional semiconductor device and the 2-dimensional semiconductor device and may continuously transmit voltages of various levels.

Exemplary embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used by itself or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a voltage supply unit suitable for supplying a voltage;
a first conductive line coupled to the voltage supply unit;
a second conductive line formed over the first conductive line;
a voltage contact plug formed over the second conductive line, wherein a height from a bottom of the second conductive line to a top of the second conductive line is greater than a height from a bottom of the voltage contact plug to a top of the voltage contact plug;
a voltage transmission line formed over the voltage contact plug; and
a switching element suitable for switching the voltage transferred from the voltage transmission line.

2. The semiconductor device of claim 1, wherein the first conductive line has substantially the same height as a height of a gate of the switching element, and the first conductive line is formed of the same material as a material of the gate of the switching element.

3. The semiconductor device of claim 2, wherein the first conductive line is formed of polysilicon.

4. The semiconductor device of claim 1, wherein the second conductive line is formed of a material having a lower resistance than a resistance of the first conductive line.

5. The semiconductor device of claim 4, wherein the second conductive line is formed of tungsten.

6. The semiconductor device of claim 1, wherein a width of the second conductive line is greater than a width of the voltage contact plug.

7. The semiconductor device of claim 1, wherein a width of the voltage transmission line is substantially the same as a width of an upper portion of the voltage contact plug.

8. A semiconductor device, comprising:
a gate line formed at a first region of a substrate;
a junction region formed in contact with the gate line;
a first gate contact plug formed over the junction region;
a second gate contact plug formed over the first gate contact plug;
a first conductive line formed at a second region of the substrate;
a second conductive line formed over the first conductive line;
a voltage contact plug formed over the second conductive line, wherein a height from a bottom of the second conductive line to a top of the second conductive line is greater than a height from a bottom of the voltage contact plug to a top of the voltage contact plug; and
a voltage transmission line suitable for coupling the second gate contact plug to the voltage contact plug.

9. The semiconductor device of claim 8, wherein a height from a bottom of the first gate contact plug to a top of the first gate contact plug is substantially the same as a height from a bottom of the first conductive line to a top of the second conductive line.

10. The semiconductor device of claim 8, wherein a height from a bottom of the second gate contact plug to a top of the second gate contact plug is substantially the same as a height from a bottom of the voltage contact plug to a top of the voltage contact plug.

11. The semiconductor device of claim 8, wherein a width of the first gate contact plug is greater than a width of the second gate contact plug.

12. A semiconductor device, comprising:
a memory cell array including vertical strings;
a plurality of lines coupled to an upper portion of the vertical strings;
a switching element including a junction region and a gate line;
a gate contact plug coupled to the junction region;
a first conductive line;
a second conductive line formed over the first conductive line;
a voltage contact plug formed over the second conductive line; and
a voltage transmission line suitable for coupling the gate contact plug to the voltage contact plug,
wherein the voltage transmission line is formed on a same plane as the plurality of lines.

13. The semiconductor device of claim 12, wherein the memory cell array has a three-dimensional structure in which memory cells are separated from one another and stacked in a vertical direction to a surface of the substrate.

14. The semiconductor device of claim 12, wherein the lines include at least one of signal transmission lines and bit lines for transmitting operating signals.

15. The semiconductor device of claim 12, wherein the gate contact plug includes a first gate contact plug formed over the junction region and a second gate contact plug formed over the first gate contact plug.

16. The semiconductor device of claim 15, wherein a height from a bottom of the first gate contact plug to a top of the first gate contact plug is substantially the same as a height from a bottom of the first conductive line to a top of the second conductive line.

17. The semiconductor device of claim 15, wherein a height from a bottom of the second gate contact plug to a top of the second gate contact plug is substantially the same as a height from a bottom of voltage contact plug to a top of the voltage contact plug.

18. The semiconductor device of claim 12, wherein the second conductive line is of a line shape formed along the first conductive line.

19. The semiconductor device of claim 12, wherein a height from a bottom of the second conductive line to a top of the second conductive line is greater than a height from a bottom of the voltage contact plug to a top of the voltage contact plug.

* * * * *